United States Patent [19]

Mourant et al.

[11] Patent Number: 5,697,092
[45] Date of Patent: Dec. 9, 1997

[54] FLOATING FET MIXER

[75] Inventors: Jean-Marc Mourant, Groton, Mass.; Holly A. LaFerrara, Nashua, N.H.

[73] Assignee: The Whitaker Corporation, Wilmington, Del.

[21] Appl. No.: 676,767

[22] Filed: Jul. 8, 1996

[51] Int. Cl.$^6$ ............................................. H04B 1/28
[52] U.S. Cl. ................................. 455/323; 455/333
[58] Field of Search ............................ 455/325, 330, 455/333; 327/110, 355, 552, 558

[56] References Cited

U.S. PATENT DOCUMENTS

| | | | |
|---|---|---|---|
| 3,769,604 | 10/1973 | Atkinson | 455/103 |
| 4,215,280 | 7/1980 | Mahig | 327/552 |
| 4,317,230 | 2/1982 | Boubouleix | 455/319 |
| 4,705,967 | 11/1987 | Vasile | 327/581 |
| 4,924,115 | 5/1990 | Yazdy | 327/552 |
| 4,947,062 | 8/1990 | Weiner et al. | 307/529 |
| 5,168,180 | 12/1992 | Bayer et al. | 327/558 |
| 5,265,266 | 11/1993 | Trinh | 455/326 |
| 5,325,000 | 6/1994 | Birkeland et al. | 307/529 |
| 5,420,558 | 5/1995 | Ito et al. | 336/200 |
| 5,513,390 | 4/1996 | Vice | 455/333 |
| 5,517,688 | 5/1996 | Fajen et al. | 455/333 |
| 5,548,239 | 8/1996 | Kohama | 455/83 |
| 5,551,076 | 8/1996 | Bonn | 455/333 |

OTHER PUBLICATIONS

"Floating Gasfet Circuits Offering Unique Signal Processing From DC EHF", C.F. Vasile; Haseltine Corp. Greenlawn, NY 5 pages, 1985.
"A Low Cost Mixer For Wireless Applications"; Jean-Marc Mourant; M/A-COM, Micro-Electronics Division; 1995 IEEE MTT-S Digest; 4 pages, 1995.

Primary Examiner—Reinhard J. Eisenzopf
Assistant Examiner—Sam Bhattacharya

[57] ABSTRACT

A floating FET mixer (1) comprises: a field effect transistor, FET, (2) having a gate (11), a drain terminal (4) and a source terminal (5), an LO port (10) at which an LO signal from a local oscillator is coupled to the gate (11), primary windings (9) of a balun (3) across the drain terminal (4) and the source terminal (5), secondary windings (8) of the balun (3) coupled at its opposite ends to ground and an RF port (7), respectively, a center tap (12) on the primary windings (9), and a series biasing element (20) on the gate (11) biasing the FET (2) near pinch off.

11 Claims, 7 Drawing Sheets

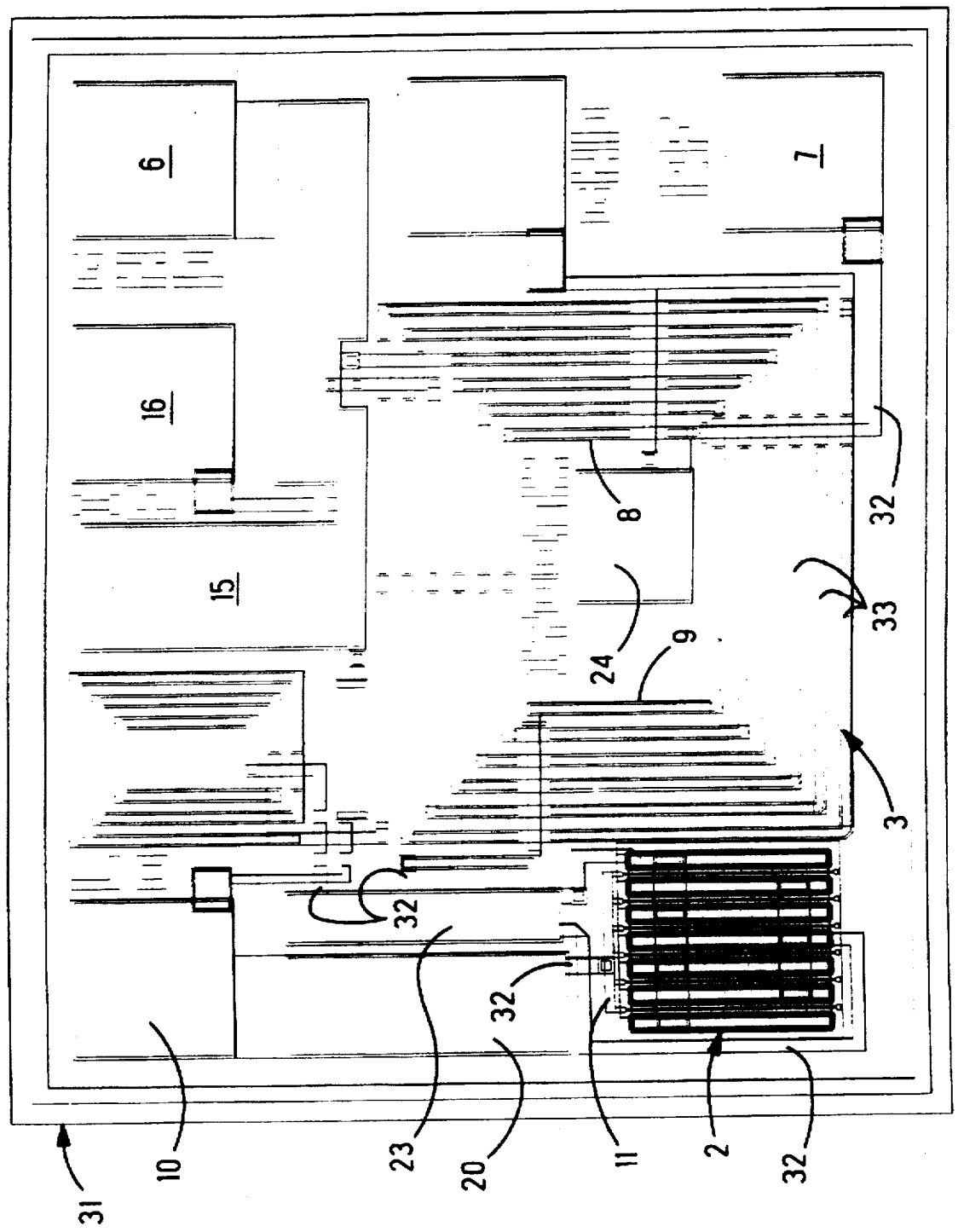

FLOATING FET MIXER

CROSS REFERENCE TO RELATED APPLICATION

This application claims the benefit of Provisional Application No. 60/009,048, filed Dec. 21, 1995.

1. Field of the Invention

The invention relates to a mixer that services wireless communications, and, more particularly, to a floating FET mixer.

2. Background of the Invention

A double balanced mixer is described in U.S. Pat. No. 4,317,230. Four conventional diodes, commonly used in a double balanced diode mixer, are replaced by four transistors. The emitter collector structures of the transistors replace the diode switching functions. Double balanced mixers do not lack in performance, but are large and expensive. They require two baluns, a diode quad or a transistor quad and an IF diplexer to extract an unbalanced IF voltage. They further require their gate electrodes coupled by chokes that further add to size and cost. The function of each balun is to transform a single ended input (voltage) to a pair of differential outputs (voltages) of equal magnitude and opposite phase. The baluns are used to couple LO (local oscillator voltage) and RF (radio frequency voltages) with the gates and with the coupled collectors, respectively. An IF diplexer extracts the IF (intermediate voltage) at the coupled emitters.

A single, floating GaAs FET (Gallium Arsenide, field effect) transistor used in a mixer, is described by Vasile, C. F., *FLOATING GASFET CIRCUITS OFFERING UNIQUE SIGNAL PROCESSING FROM DC-EHF*, 1985 GOMAC Proceedings, Pp. 305-309, 1985. Either the gate or drain electrodes of a single FET can be driven with LO from a local oscillator. For a single FET mixer wherein the gate is driven with LO, the drain and source (electrodes) are floated above ground through balanced balun primary windings. Unbalanced RF is applied through the balun. The RF, applied at one end on unbalanced secondary windings of the balun, is coupled by the balanced side of the balun across the drain and source of the FET. A center tap to ground on the balun primary windings permits unbalanced IF to be extracted at the balun.

A mixer of single FET construction with a single balun is suited for compact construction, particularly as a GaAs FET integrated circuit, as it replaces the larger quad mixers and the multiple baluns. In the past, the floating single GaAs FET mixer required active circuitry for biasing the FET drain. Additional active circuitry has been needed for DC bias, particularly as to source electrodes of quad FET transistors, as described in U.S. Pat. No. 4,947,062. Because such active circuitry has been too large for inclusion on an integrated circuit, together with the mixer, active circuitry has been relegated to being external to the integrated circuit. A problem to be solved is to provide a single FET mixer that is self biasing so as to eliminate the prior need for external biasing circuitry. A further problem to be solved resides in a need to reduce the complexity of an FET mixer for fabrication as an integrated circuit of minimum surface area.

SUMMARY OF THE INVENTION

According to an embodiment, a single FET mixer is constructed with a self biasing gate to maintain the FET at the pinch off state, which eliminates external gate biasing circuitry.

According to an embodiment, an FET mixer utilizes coupled inductors, which refers to planar inductors fabricated as integrated circuit elements, and having adjacent interleaved windings that consume a minimum spatial area.

According to an embodiment, a mixer comprises, a single FET with a self biasing gate, coupled inductors of planar construction, and planar circuit elements of the mixer that are encircled by the coupled inductors to reduce surface area to a minimum.

DESCRIPTION OF THE DRAWINGS

Embodiments of the invention will now be described, by way of example, to accompanying drawings, according to which:

FIG. 6 is a CAD layout of a floating FET mixer;

DETAILED DESCRIPTION

Figure 1:
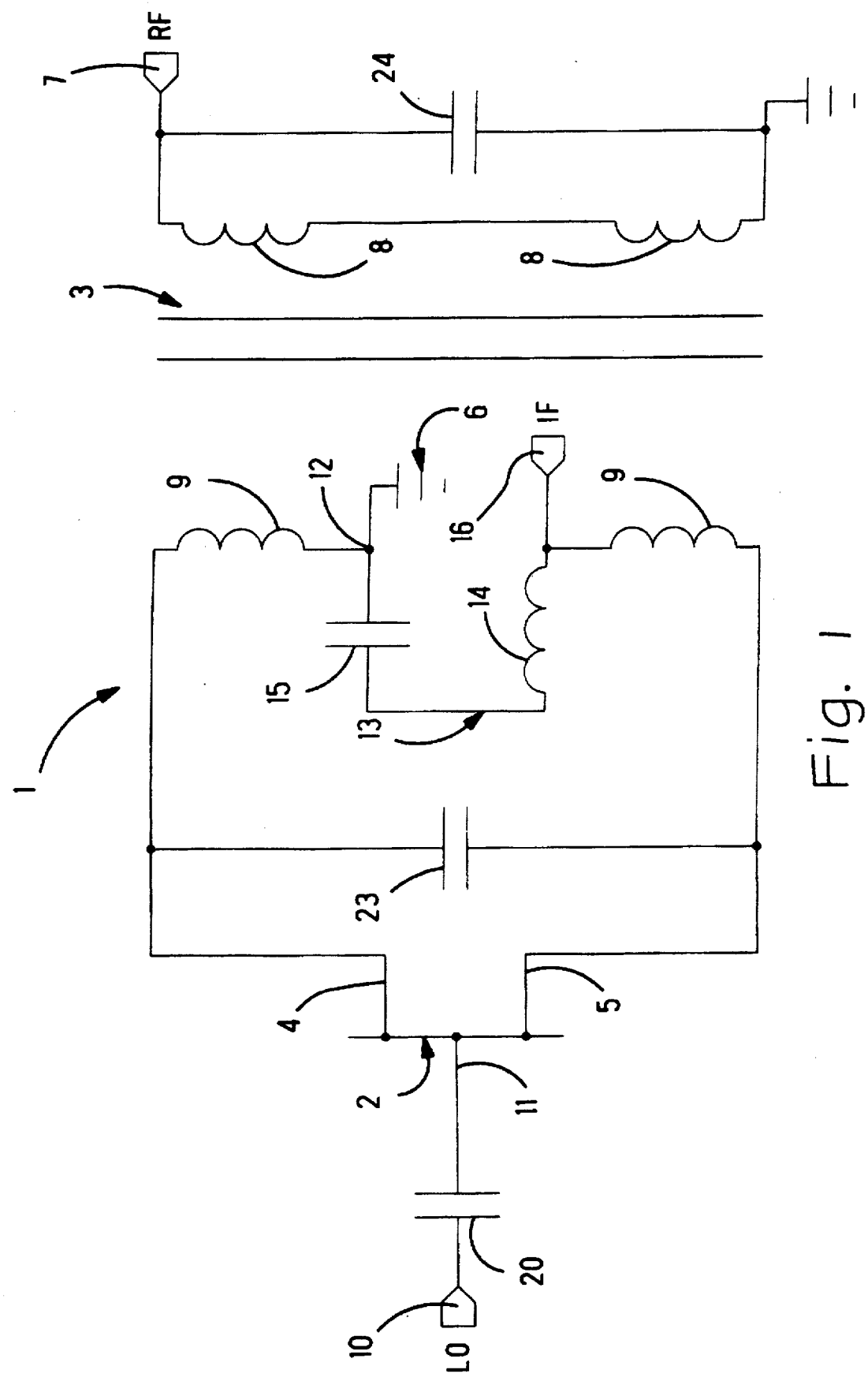
FIG. 1 is a schematic view of a single FET mixer.
Figure 3:
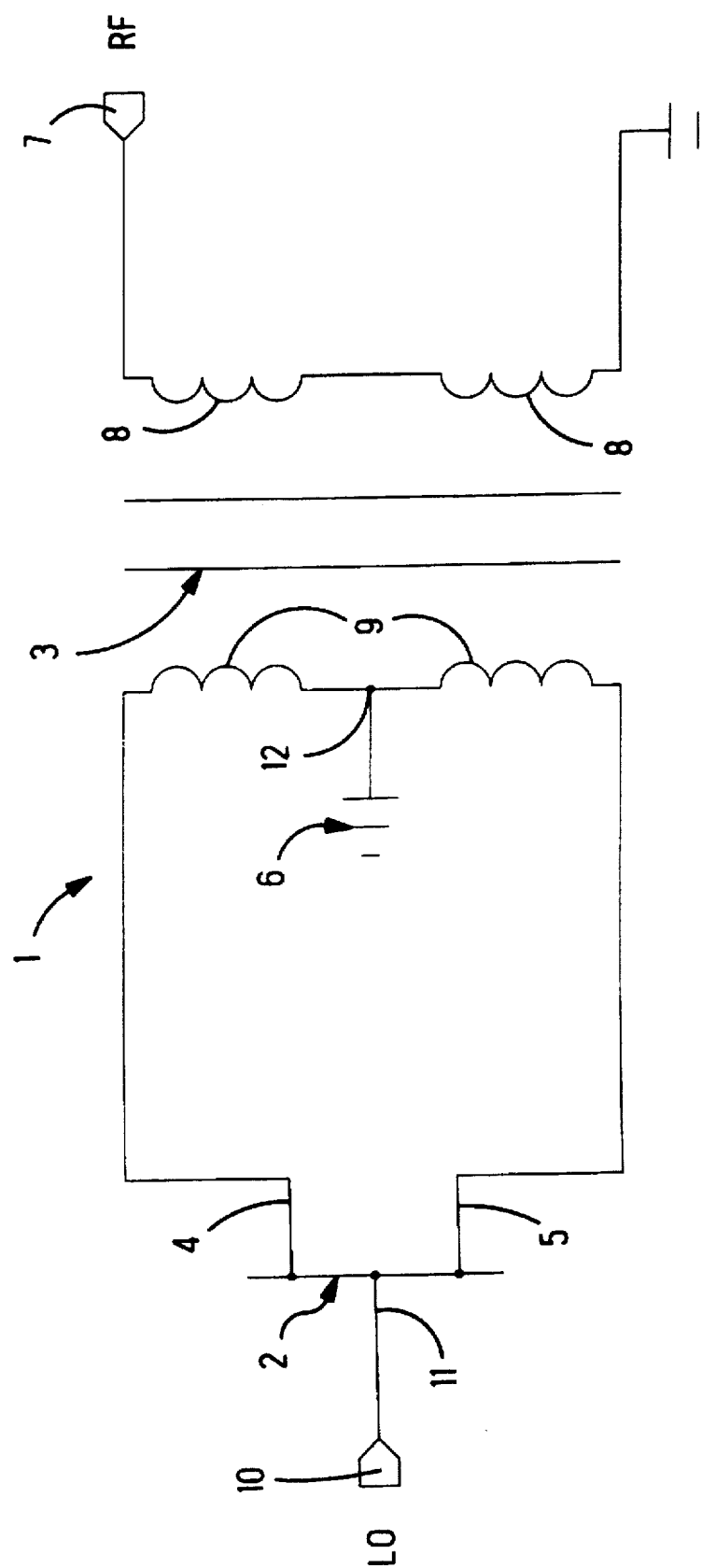
FIG. 3 is a schematic view of a simplified FET mixer.

With reference to FIGS. 1 and 3, a single floating FET mixer 1 using a single floating FET 2 and a single RF balun 3 will now be described. With reference to FIG. 3, the floating FET 2 comprises, drain and source terminals 4, 5, respectively, of a single FET 2 floated above ground 6 through the single RF balun 3. Unbalanced RF voltage applied at an RF port 7 goes through an unbalanced secondary winding 8 on the balun 3 to couple inductively with balanced primary windings 9 on the balun 3. The secondary windings 8 are coupled between the RF port 7 and ground. Unbalanced LO voltage is applied at an LO port 10 and between a gate 11, also known as a gate terminal, and a midpoint 12 or centertap on the balun 3 referenced to ground 6. The LO switches the FET on and off.

A feature of the single FET mixer 1 resides in feedback that exists between LO and RF. During operation of the FET 2, a controlling voltage for switching the FET 2 is the sum of the LO and RF voltages. The LO voltage controls the switching of the FET 2 at a low RF voltage. As the RF voltage increases, the sum of RF and LO would cause current saturation, except for the feedback. Due to the feedback, the controlling voltage decreases as the RF voltage increases, and the current can increase. The greater the LO current, the greater the current, due to the feedback.

According to an embodiment as shown in FIG. 1, an important advantage resides in elimination of an IF balun. With reference to FIG. 1, IF is extracted at the RF balun 3, thereby eliminating an IF balun and its associated cost and consumption of spatial area. An important feature of the embodiment resides in a diplexer or resonator 13 to extract IF at the RF balun 3. The balanced IF created in the FET mixer 1 is extracted at the RF balun 3 by the diplexer or resonator 13 in the form of a series inductor 14 and capacitor 15 that resonates at the frequency of the RF and shorts out center tap 12 to ground 6. The diplexer or resonator 13 further comprises, an unbalanced LO port 16 at one end of the resonator 13. At low IF frequencies, the resonator 13 serves as an open circuit to allow extraction of the IF at one end of the resonator 13. At high RF frequencies the resonator 13 serves as a short circuit to provide optimal IF voltage.

Several features of the single FET mixer 1 contributes to its suitability for elimination of external circuitry. For example, good LO to RF isolation is provided by the gate 11 of the FET 2. Whatever capacitance of the FET 2 that allows leakage through the FET 2 is compensated for by the inductance of the RF balun 7. Further, for example, a single FET 2 allows the IF port 16 and the RF port 7 to be simultaneously matched, with no impedance transformations.

One of the disadvantages of the single FET mixer 1, is the need for external biasing circuitry to switch the FET 2 for proper mixing. In order for the single FET mixer 1 to operate as a switch, the gate 11 of the FET is required to be biased with a source of voltage. In the past, external biasing circuitry has been required for biasing the gate 11 near the pinch off voltage. For example, in the past, a gate biasing port 16, FIG. 4, was connected between the LO port 10 and the gate 11. The port 16 enabled a user of the device 1 to connect external biasing circuitry 17, FIG. 4, to bias the gate 11. For example, a source 18, FIG. 4, of −Vg voltage, referenced to ground 19, through a resistor 20, can be connected to the port 16 to bias the gate 11. The complexity and size of the biasing circuitry 17 has been unsuitable for manufacture on the same integrated circuit with the single FET mixer 1. Because the biasing circuitry 17 has been unsuited for inclusion on an integrated circuit together with the mixer 1, the active circuitry 17 has been relegated to being external to the integrated circuit. A problem to be solved is to provide a single FET mixer 1 that is self biasing so as to eliminate the prior need for the external biasing circuitry 17. An object of the invention is to provide an FET mixer 1 with a self biased gate 11 to eliminate the need for external biasing circuitry 17.

Figure 2:
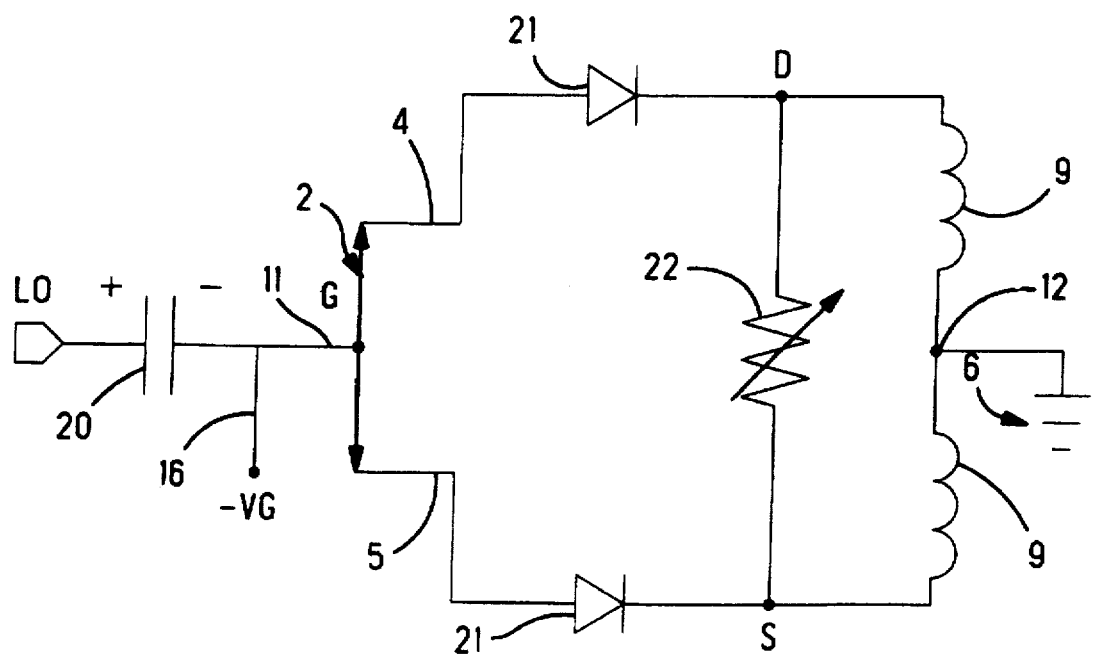
FIG. 2 is a schematic view of a single FET with gate biasing circuitry suitable for use in a mixer.

According to an embodiment, an important advantage resides in elimination of external biasing circuitry 17 for the FET mixer 1. With reference to FIGS. 1, 2 and 3, the FET 2 is constructed to operate in a passive mode, such that the LO port 10 is coupled to the gate 11 through a self biasing gate element, shown generally by numeral 20. The self biasing gate element 20 is in the form of a series biasing capacitor applied at the gate 11 of the FET 2. The capacitor charges up with the LO voltage and maintains the gate 11 near the pinch off voltage.

Figure 4:
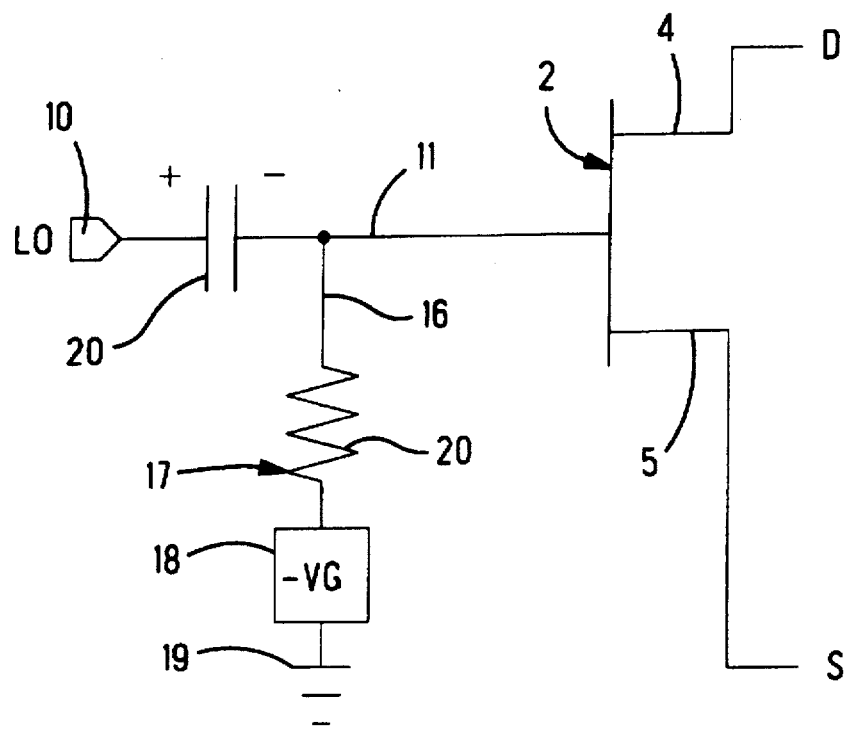
FIG. 4 is a schematic view of a single FET with gate biasing circuitry.

With reference to FIGS. 1, 2 and 4, the series biasing capacitor 20 is reduced in complexity and in size, as compared with the external gate biasing circuitry 17. The capacitor 20 is capable of manufacture as a circuit element on the same integrated circuit, together with the single FET 2, the RF balun 3 and the diplexer 13. Thus, the capacitor 20 eliminates external bias circuitry 17. For convenience, as shown in FIGS. 2 and 4, the capacitor 20 and the gate biasing port 16 are combined, such that the gate biasing port 16 is connected between the series biasing capacitor 20 and the gate 11. The port 16 does provide an option to bias the FET 2 with an external source of −Vg to lower the LO voltage needed to charge the gate biasing capacitor 20. However, the LO charged capacitor 20 is useable without the external source of −Vg when sufficient LO voltage is present to charge the capacitor 20 to bias the FET 2 near the pinch off voltage. Further with reference to FIG. 2, the capacitor 20 charges up the LO voltage through FET junction diodes 21 on the drain 4 and source 5 of the FET 2, which diodes 21 are on opposite ends of the RF balun windings 9. A variable balancing resistor 22 of relatively high resistance connects across the diode outputs of the diodes 21.

Figure 5:
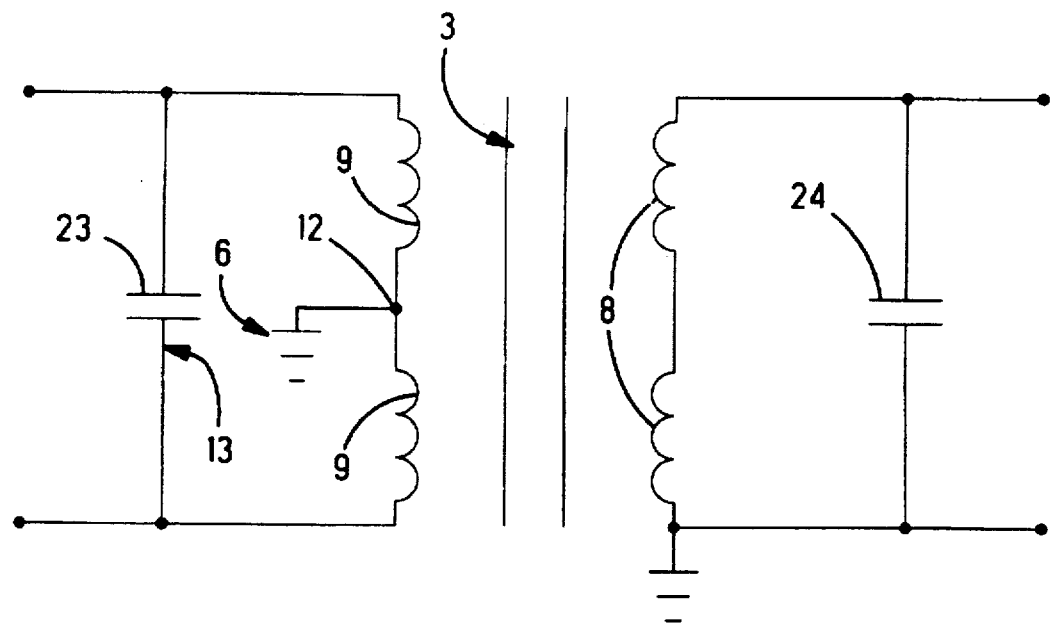
FIG. 5 is a schematic view of a tuned balun transformer.
Figure 7:
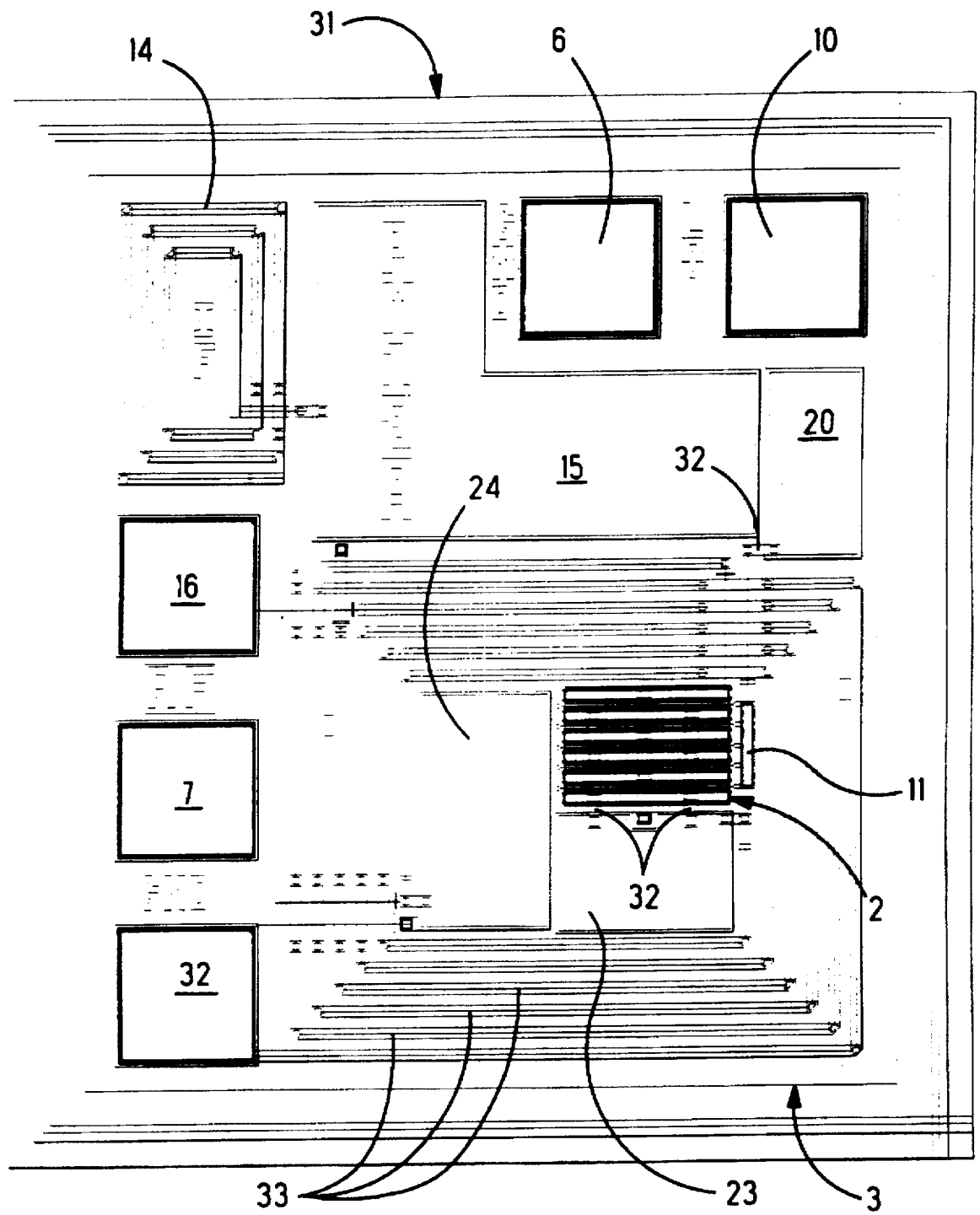
FIG. 7 is a CAD layout of a floating FET mixer with minimum spatial area.

The RF balun 3 is compact in size. The best technique for achieving small size, particularly for operation of the mixer 1 below 6 GHz, is to use coupled inductors 8, 9 and 14 as shown in FIGS. 5, 6 and 7. As shown in each of FIGS. 6 and 7, the coupled inductors 8, 9 and 14 are fabricated as an integrated circuit using thin film technology, with the primary and secondary windings 8, 9 in the form of thin film, planar metal spirals that are interleaved with one another in a side by side arrangement. Such technology is described in U.S. Pat. No. 5,420,558 to Ito et al., and U.S. Patent application serial No. filed, attorney docket number 16313. According to U.S. Pat. No. 5,420,558, to Ito et al., silicon dioxide between multiple spirals of thin film construction provides the coupled inductors with reduced self capacitance. The presence of self capacitance in the coupled inductors would be undesirable if the resonator would provide undesired parallel resonance to cancel inductive behavior.

U.S. Patent application serial No. Filed attorney docket number 16313, describes a balun construction with low capacitive coupling within the operating frequency. However, in the embodiment, with reference to FIGS. 1, 5, 6 and 7, a resonator capacitor 23, across the balanced primary windings 9 of the balun 3, provide a resonant frequency that is tuned to the desired RF band at the useable operating frequency. With reference to FIG. 5, a diagrammatic view of the balun 3 is disclosed with a resonator 13, in part, comprised of the resonator capacitor 23, across the primary windings 9. A balancing second resonator capacitor 24, not required in all operating frequencies, is across the unbalanced secondary windings 8 of the balun 3.

Figure 8:
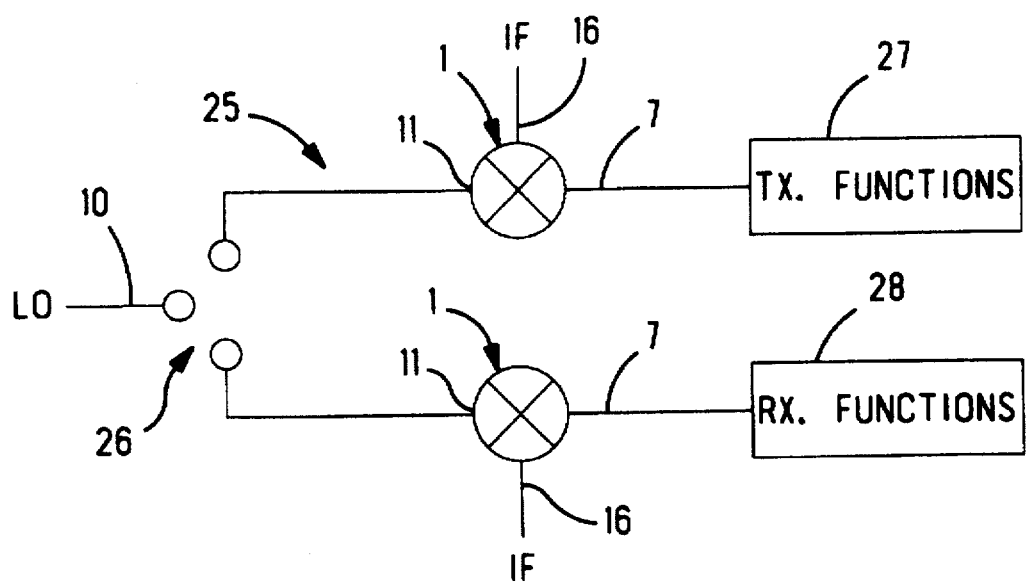
FIG. 8 is a schematic view of a floating FET mixer in transceiver architecture comprising, a transceiver with a single switch and two floating FET mixers in the receive circuitry and the transmit circuitry.
Figure 9:
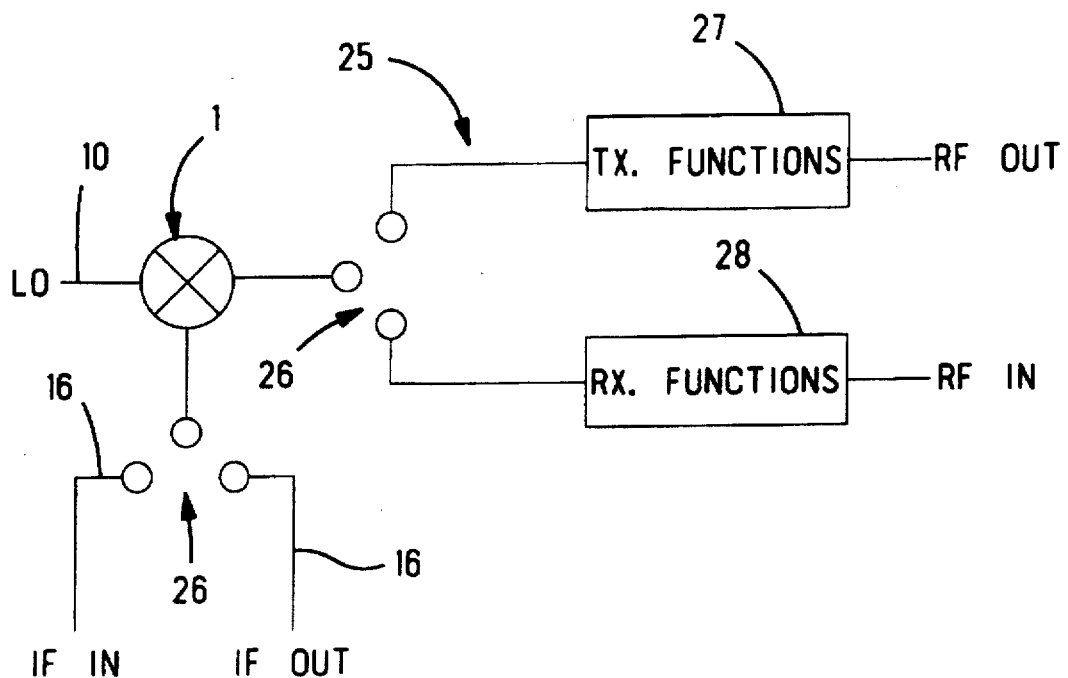
FIG. 9 is a schematic view of a transceiver that incorporates a single, floating FET mixer and two switches.
Figure 10:
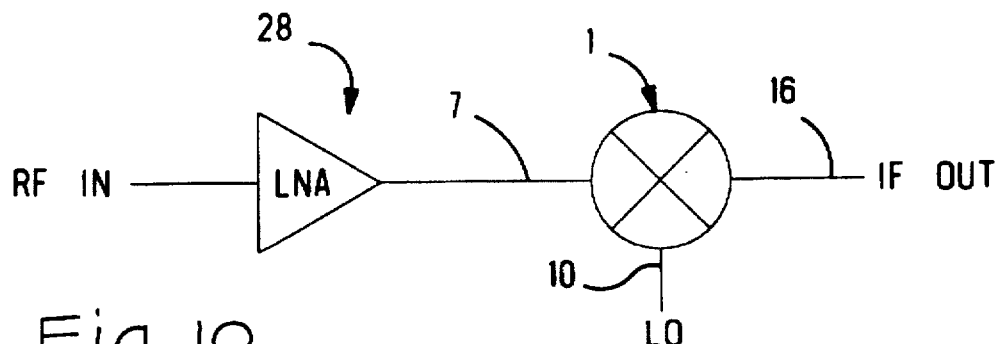
FIG. 10 is a schematic view of in and out IF ports in transmitter, upconvert, circuitry.

With reference to FIGS. 8, 9 and 10, various receivers, transmitters and transceivers incorporate the floating FET mixer 1. FIG. 8 illustrates a transceiver 25 with a single switch 26 and two floating FET mixers 1. On a transmitter side of the transceiver 25 the switch 26 connects the LO port 10 with the gate 11. Tx transmitter circuitry 27 is coupled to the output RF port 7. The LO port 10 is connected through the single switch 26 to a first mixer 1 and the to the IF port and the Tx transmitter circuitry 27 of well known functions. On the receiver side of the transceiver 25, the switch 26 connects the LO port 10 with the gate 11. Rx receiver circuitry 28 is coupled to the input IF 16. The LO port 10 is connected through the switch 26 to a second mixer 1 to an input IF port 16 and the Rx receiver circuitry 28 of well known functions.

FIG. 9 shows a transceiver 25 that incorporates a single, floating FET mixer 1 and two switches 26. The transceiver 25 comprises, Tx transmitter circuitry 27 and Rx receiver circuitry 28 connected by a first switch 26 to the FET. A second switch connects the mixer to in and out IF ports 16, respectively. A first switch 26 connects the LO port 10 of the mixer 1 to the Tx transmitter circuitry 27, the same as in FIG. 8. This requires the second switch 26 to connect an input IF port 16 to the mixer 1. The first switch 26 can be switched to connect with the Rx receiver circuitry 28, requiring the second switch 26 to connect the output IF port 16 with the mixer 1.

Figure 11:
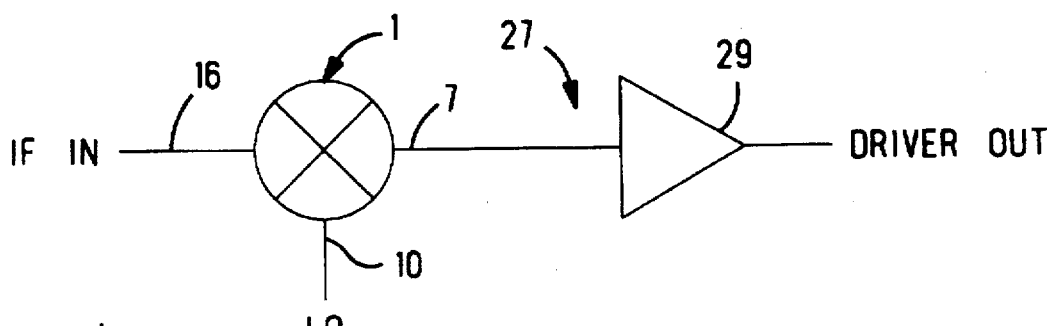
FIG. 11 is a schematic view of in and out IF ports in receiver, downconvert, circuitry.

FIGS. 10 and 11 show the in and out IF ports 16 in respective transmitter circuitry 27 and receiver circuitry 28. With reference to FIG. 11, the in IF port 16 of a transmitter 27 is connected, together with an LO port 10 to a first mixer 1, and then through a low noise amplifier 29 to a driver output port 30. The low noise amplifier 29 is coupled between the RF port 7 and the FET 2 of the mixer 1. With reference to FIG. 10, the output IF port 16 of a receiver 28 is connected, together with an LO port 10 to the mixer 1 into which RF is received through an RF port 7 and through the low noise amplifier 29.

With reference to FIGS. 6 and 7, circuitry comprising the mixer 1 is fabricated on a 10 mil GaAs wafer 31, without via holes, and using a one micron gate, MESFET process. An air bridge construction, as described in U.S. patent application, serial number, is provided at each location where one circuit trace 32 crosses another circuit trace 32 without establishing an electrical connection. The air gap is interposed between the traces, to prevent an electrical short between the traces 32.

In FIGS. 6 and 7, the FET 2 has its gate 11 connected by a circuit trace 32 to the gate biasing capacitor 20, and then to the LO port 10. The drain terminal 4 and source terminal 5 are connected by circuit traces 32 to the capacitor 23 and the series connected, diplexer capacitor 15 and inductor 14, and then to the IF port 16. The RF port 7 is connected by a circuit trace 32 to the secondary windings 8 of the balun 3 and to a resonator capacitor 24. The windings 8 are constructed by corresponding spirals 32. With reference to FIGS. 6 and 7, further economy of size of the mixer is accomplished by locating at least a portion of the mixer circuitry within interior space encircled by the spirals 33 of the balun 3. With reference to FIG. 6, the resonator capacitor 24 is located within an interior space that is encircled by the spirals 33 of the balun 3. With reference to FIG. 7, both the capacitors 24 and 23, as well as the FET 2, are located within an interior space that is encircled by the spirals 33 of the balun 3.

What is claimed is:

1. A floating FET mixer comprises: a field effect transistor, FET, having a gate and a drain terminal and a source terminal, an LO port at which an LO signal from a local oscillator is coupled to the gate, primary windings of a balun across the drain terminal and the source terminal, secondary windings of the balun coupled at its opposite ends to ground and an RF port, respectively, a matching balancing capacitor coupled across the RF port and ground at the opposite ends of the secondary windings, a center tap ground on the primary windings, and a series biasing element on the gate biasing the FET near pinch off.

2. A floating FET mixer as recited in claim 1, and further comprising: a balancing capacitor coupled across the drain and source electrodes.

3. A floating FET mixer as recited in claim 1, and further comprising: a diplexer coupled between the midpoint of the primary windings and the center tap.

4. A floating FET mixer as recited in claim 1, and further comprising: a diplexer coupled between the midpoint of the primary windings and the center tap, an inductor of the diplexer being coupled with the primary windings, and an IF port at the inductor.

5. A floating FET mixer as recited in claim 1, and further comprising: a transceiver circuit having transmitter circuitry and receiver circuitry connected by a switch to the FET.

6. A floating FET mixer as recited in claim 1, and further comprising: a low noise amplifier coupled between the RF port and the FET, the FET being in receiver circuitry.

7. A floating FET mixer as recited in claim 1, and further comprising: the FET being in transmitter circuitry wherein, the FET is coupled to an output amplifier and the RF port and the LO port.

8. A floating FET mixer as recited in claim 1 wherein, primary windings and secondary windings of the balun are in the form of thin film, planar metal spirals that are interleaved with one another in a side by side arrangement.

9. A floating FET mixer as recited in claim 1 wherein, primary windings and secondary windings of the balun are in the form of thin film, planar metal spirals that are interleaved with one another in a side by side arrangement, and a balancing capacitor across the primary windings is encircled by the spirals.

10. A floating FET mixer comprises: a field effect transistor, FET, having a gate and a drain terminal and a source terminal, an LO port at which an LO signal from a local oscillator is coupled to the gate, a switch connecting the LO port with the gate, primary windings of a balun across the drain terminal and the source terminal, secondary windings of the balun coupled at its opposite ends to ground and an RF port, respectively, a center tap ground on the primary windings, and a series biasing element on the gate biasing the FET near pinch off.

11. A floating FET mixer comprises: a field effect transistor, FET, having a gate and a drain terminal and a source terminal, an LO port at which an LO signal from a local oscillator is coupled to the gate, a switch connecting the LO port with the gate, and receiver circuitry coupled to the FET, and transmitter circuitry coupled to the FET, primary windings of a balun across the drain terminal and the source terminal, secondary windings of the balun coupled at its opposite ends to ground and an RF port, respectively, a center tap ground on the primary windings, and a series biasing element on the gate biasing the FET near pinch off.

* * * * *